(12) United States Patent
Zhang

(10) Patent No.: US 11,258,028 B2
(45) Date of Patent: Feb. 22, 2022

(54) QUANTUM DOT DEVICE BASEPLATE, MANUFACTURE METHOD THEREFOR AND QUANTUM DOT DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Aidi Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/818,682

(22) Filed: Mar. 13, 2020

(65) Prior Publication Data
US 2021/0098726 A1  Apr. 1, 2021

(30) Foreign Application Priority Data

Sep. 26, 2019  (CN) .......................... 201910918077.X

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0003* (2013.01); *H01L 51/0029* (2013.01);
(Continued)

(58) Field of Classification Search
CPC ............... H01L 51/502; H01L 51/0003; H01L 51/5008; H01L 51/5072
See application file for complete search history.

(56) References Cited

U.S. PATENT DOCUMENTS 5,306,572 A  4/1994 Ohashi et al.
5,834,100 A  11/1998 Marks et al.
(Continued)

FOREIGN PATENT DOCUMENTS

CN  108075043 A  5/2018
CN  108807720 A  11/2018
(Continued)

OTHER PUBLICATIONS

Wang et al., "Direct optical lithography of functional inorganic nanomaterials", Science 357, pp. 385-388, Jul. 28, 2017. Downloaded from http://science.sciencemag.org/.
(Continued)

*Primary Examiner* — Anthony Ho
(74) *Attorney, Agent, or Firm* — Kinney & Lange, P.A.

(57) ABSTRACT

The present disclosure provides a quantum dot device baseplate, a manufacture method therefor and a quantum dot device. The quantum dot device baseplate comprises: a substrate; a cathode disposed on the substrate; an electron transport layer disposed on a surface of the cathode away from the substrate; a linking layer disposed on a surface of the electron transport layer away from the substrate and bonded to the electron transport layer via a chemical bond; and a quantum dot layer disposed on a surface of the linking layer away from the substrate and bonded to the linking layer via a chemical bond.

18 Claims, 5 Drawing Sheets

(52) U.S. Cl.
CPC ...... *H01L 51/5008* (2013.01); *H01L 51/5072* (2013.01); *H01L 51/56* (2013.01); *H01L 2251/558* (2013.01)

(56) References Cited

U.S. PATENT DOCUMENTS

| | | |
|---|---|---|
| 10,103,345 B2 | 10/2018 | Yoon et al. |
| 2008/0135835 A1 | 6/2008 | Seo et al. |
| 2010/0308369 A1 | 12/2010 | Gleason et al. |
| 2018/0033988 A1 | 2/2018 | Walter et al. |
| 2018/0138434 A1* | 5/2018 | Yoon .................. H01L 51/502 |

FOREIGN PATENT DOCUMENTS

| | | |
|---|---|---|
| CN | 109390476 A | 2/2019 |
| CN | 109509842 A | 3/2019 |
| CN | 110010782 A | 7/2019 |
| CN | 110098341 A | 8/2019 |
| CN | 112018250 A | 12/2020 |

OTHER PUBLICATIONS

Wang et al., "Supplementary Material for Direct optical lithography of functional inorganic nanomaterials", Science 357, 385 (2017). Downloaded from www.sciencemag.org/content/357/364/385/suppl/DCI.

First Chinese Office Action dated Jul. 21, 2021, received for corresponding Chinese Application No. 201910918077.X, 18 pages.

* cited by examiner

QUANTUM DOT DEVICE BASEPLATE, MANUFACTURE METHOD THEREFOR AND QUANTUM DOT DEVICE

CROSS REFERENCE TO RELATED APPLICATION

The present application claims a priority from Chinese Patent Application No. 201910918077.X, filed on Sep. 26, 2019, with a title of "Quantum dot device baseplate, manufacture method therefor and quantum dot device," the entirety of which is incorporated herein by reference.

TECHNICAL FIELD

The present disclosure relates to the technical field of display, and particularly to a quantum dot device baseplate, a manufacture method therefor and a quantum dot device.

BACKGROUND

With emergence and development of new display technologies, the demand for high resolution display products in the market is increasing. Fluorescent quantum dot is an important inorganic fluorescent nanomaterial recently discovered. Due to excellent physical, chemical and optical properties, quantum-dots light emitting diodes (QLED), in which fluorescent quantum dots are used as a luminescent material in the light emitting diode field, have attracted more and more attentions in the academic community and industry community. Currently, it is required to perform one patterning process separately for fluorescent quantum dots of each color. In order to perform patterning of fluorescent quantum dots of different colors (i.e., introducing red, green and blue light emitting layers side by side in one pixel and so on), it needs to repeat the patterning process for several times. However, the quantum dots are liable to falling off and loss during the patterning.

SUMMARY

In one aspect, the present disclosure provides a quantum dot device baseplate. According to embodiments of the present disclosure, the quantum dot device baseplate comprises: a substrate; a cathode disposed on the substrate; an electron transport layer disposed on a surface of the cathode away from the substrate; a linking layer disposed on a surface of the electron transport layer away from the substrate and bonded to the electron transport layer via a chemical bond; and a quantum dot layer disposed on a surface of the linking layer away from the substrate and bonded to the linking layer via a chemical bond.

According to the embodiments of the present disclosure, the linking layer comprises a main body structure having a first surface facing the electron transport layer and a second surface away from the electron transport layer.

According to the embodiments of the present disclosure, the main body structure is a silicon oxide type structure comprising at least one silicon oxide layer.

According to the embodiments of the present disclosure, the linking layer is bonded to the electron transport layer via a Si—O bond formed by a silicon atom on the first surface and an oxygen atom on the surface of the electron transport layer away from the substrate.

According to the embodiments of the present disclosure, the linking layer has a linking group on the second surface of the main body structure, and is bonded to the quantum dot layer via a chemical bond formed between the linking group and a quantum dot.

According to the embodiments of the present disclosure, the linking group comprises a mercapto group (SH) and/or an amino group ($NH_2$).

According to the embodiments of the present disclosure, a projection of a region in which the linking group is located on the substrate is at least partially overlapped with a projection of the quantum dot layer on the substrate.

According to the embodiments of the present disclosure, the linking layer may be represented by a general formula below:

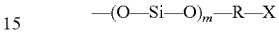

wherein (O—Si—O) represents a silicon oxide layer; m represents a number of the silicon oxide layer, and is in a range from 1 to 15; and R—X represents the linking group, wherein R represents a divalent organic group, and X represents a mercapto group or an amino group.

According to the embodiments of the present disclosure, a material for the electron transport layer comprises at least one selected from the group consisting of zinc oxide, magnesium zinc oxide, aluminum zinc oxide, indium zinc oxide, and a rare earth ion doped zinc oxide.

According to the embodiments of the present disclosure, a material for the quantum dot layer comprises at least one selected from the group consisting of CdTe, CdS, CdSe, ZnSe, InP, CuInS, CuInSe, PbS, CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, $CsPbCl_3$/ZnS, $CsPbBr_3$/ZnS, $CsPbI_3$/ZnS, an organic-inorganic perovskite quantum dot of $CH_3NH_3PbX_3$, an entirely inorganic perovskite quantum dot of $CsPbX_3$, a carbon quantum dot, and a silicon quantum dot, wherein X is Cl, Br or I.

In another aspect, the present disclosure provides a quantum dot device. According to the embodiments of the present disclosure, the quantum dot device comprises the quantum dot device baseplate as described previously.

In another aspect, the present disclosure provides a method for manufacturing the quantum dot device baseplate as described previously. According to the embodiments of the present disclosure, the method comprises: forming a cathode on a substrate; forming an electron transport layer on a surface of the cathode away from the substrate; forming a linking layer on a surface of the electron transport layer away from the substrate, with a chemical bonding being formed between the linking layer and the electron transport layer; and forming a quantum dot layer on a surface of the linking layer away from the substrate, with a chemical bonding being formed between the quantum dot layer and the linking layer.

According to the embodiments of the present disclosure, the forming of the linking layer comprises:

Step 1: applying a solution of silicon source on the surface of the electron transport layer away from the substrate, and forming a main body structure of the linking layer on the surface of the electron transport layer through a reaction between the silicon source and the surface; and Step 2: contacting the main body structure obtained in Step 1 with a solution of silane reagent to introduce a linking group on a surface of the main body structure away from the electron transport layer.

According to the embodiments of the present disclosure, the surface of the electron transport layer away from the substrate is a hydrophilic surface, and the linking layer is bonded to the electron transport layer via a Si—O bond formed by a silicon atom and an oxygen atom on the surface of the electron transport layer.

According to the embodiments of the present disclosure, the silicon source comprises at least one selected from the group consisting of tetramethyl orthosilicate, tetraethyl orthosilicate, diphenyl dimethoxysilane, hexadecyl trimethoxysilane, isobutyl triethoxysilane, isobutyl trimethoxysilane, dimethyl dimethoxysilane, methyl tris(m-ethylethylketoximino)silane, methyl triacetoxylsilane, iso-cyanatopropyl triethoxysilane, phenyl trimethoxysilane, phenyl triethoxysilane, octyl trimethoxysilane, n-octyl triethoxysilane, dodecyl triethoxysilane, dodecyl trimethoxysilane, and vinyl tris(methylethylketoximino)silane.

According to the embodiments of the present disclosure, the main body structure has a thickness of 0.5 to 6 nm.

According to the embodiments of the present disclosure, contacting the main body structure with the solution of silane reagent comprises: applying the solution of silane reagent on a surface of the main body structure away from the electron transport layer, or immersing the surface of the main body structure away from the electron transport layer into the solution of silane reagent.

According to the embodiments of the present disclosure, the silane reagent comprises at least one selected from the group consisting of a thiolated silane reagent and an aminated silane reagent.

According to the embodiments of the present disclosure, the thiolated silane reagent comprises at least one selected from the group consisting of 3-mercaptopropyl trimethoxysilane, 3-mercaptopropyl triethoxysilane, 3-mercaptopropyl methyl dimethoxysilane, 3-mercaptopropyl methyl diethoxysilane, mercaptopropylsilane, 3-mercaptopropyl trimethylsilane, cage-type polysesquioxane (PSS)-(3-mercapto)propyl-heptaisobutyl substituted, and bis[3-(triethoxysilyl)propyl]-tetrasulfide.

According to the embodiments of the present disclosure, the aminated silane reagent comprises at least one selected from the group consisting of 3-aminopropyl trimethoxysilane, 3-aminopropyl triethoxysilane, 3-aminopropyl methyl diethoxysilane, NO-aminoethyl-γ-aminopropyl)trimethoxysilane, N-(β-aminoethyl-γ-aminopropyl) methyl dimethoxy silane, diethylenetriaminopropyl trimethoxysilane, 3-ureidopropyl trimethoxysilane, n-butylaminopropyl trimethoxysilane, N-(2-aminoethyl)-3-aminopropyl trimethoxysilane, N-[3-(trimethoxysilyl)propyl]ethylenediamine, 3-(phenylpropyl)propyl trimethoxysilane, N-phenyl-3-aminopropyl trimethoxysilane, 3-(2-aminoethyl)-aminopropyl trimethoxysilane, N-(n-butyl)-3-aminopropyl trimethoxysilane, and N-(β-aminoethyl-γ-aminopropyl) trimethoxysilane.

According to the embodiments of the present disclosure, Step 1 and Step 2 are carried out in an air atmosphere.

DETAILED DESCRIPTION

Currently, in the related art of QLED, quantum dots are liable to falling off and loss during the patterning process, and there is a need for improvement.

The present disclosure is intended to at least solve one of the technical problems in the related art to some extent. Thus, an object of the present disclosure is to provide a quantum dot device baseplate in which the quantum dots have a high adhesion, and are not liable to falling off and loss.

The embodiments of the present disclosure will be described in detail below. The embodiments described below are exemplary, and are only intended to illustrate the present disclosure, but cannot be understood to limit the present disclosure. Where particular technology or condition is not indicated in the embodiments, the embodiments can be implemented according to the technology or condition as described in the literatures in the art, or according to the product specification. Where the manufactures of reagents or instruments are not indicated, they are all common products commercially available from the market.

Figure 1:
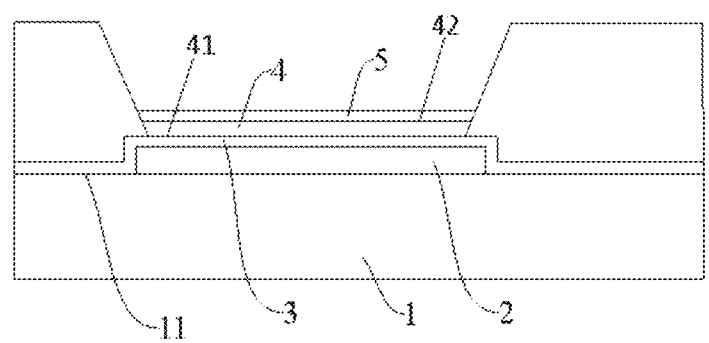
FIG. 1 is a schematic structural diagram of a quantum dot device baseplate according to one embodiment of the present disclosure.

In one aspect, the present disclosure provides a quantum dot device baseplate. According to the embodiments of the present disclosure, referring to FIG. 1, the quantum dot device baseplate comprises: a substrate 1; a cathode 2 disposed on a surface 11 of the substrate 1; an electron transport layer 3 disposed on a surface of the cathode 2 away from the substrate 1; a linking layer 4 disposed on a surface of the electron transport layer 3 away from the substrate 1 and bonded to the electron transport layer 3 via a chemical bond at a first surface 41 facing the electron transport layer 3; and a quantum dot layer 5 disposed on a second surface 42 of the linking layer 4 away from the electron transport layer 3 and bonded to the linking layer 4 via a chemical bond. In the quantum dot device baseplate, the linking layer allows the quantum dot layer to be bonded to the electron transport layer via the action of chemical bonds, greatly increasing the adhesion of the quantum dot layer, which makes the quantum dot layer bond firmly and not liable to falling off. This ensures good use effect, and contributes to improving process yield and reducing cost.

According to the embodiments of the present disclosure, the type and structure of the substrate are not particularly limited, and can be selected according to practical requirements. In some particular embodiments, the substrate may be a glass substrate, a flexible substrate (polyimide (PI), ultra-thin glass, polymer, and so on) or the like.

According to the embodiments of the present disclosure, the cathode is used to provide electrons to the quantum dot layer. A material for the cathode may be selected according to practical requirements. In some particular embodiments, a transparent electrode material, such as a transparent conductive oxide, e.g. indium tin oxide (ITO) and fluorine doped tin oxide (FTO), may be used as the material for the cathode.

According to the embodiments of the present disclosure, in order to make a recombination of an electron (injected from the electrode) and a hole occur in the light emitting layer, it is required to dispose an electron transport layer to improve luminescence efficiency. A material which may be used for the electron transport layer includes, but not limited to: at least one selected from the group consisting of zinc oxide, magnesium zinc oxide, aluminum zinc oxide, indium zinc oxide, and a rare earth ion doped zinc oxide. In particular, the rare earth ion doped may be at least one selected from the group consisting of lanthanum, cerium, neodymium, promethium, samarium, europium and gadolinium. Thus, the electron transport layer has a good hydrophilicity, and can effectively form a —O—Si— chemical bond with the linking layer (for example, the silicon oxide main body structure of the linking layer).

According to the embodiments of the present disclosure, a functional group which can react with the electron transport layer and a functional group which can react with the quantum dot layer may be respectively introduced by the linking layer, such that the linking layer is chemically bonded with both the electron transport layer and the quantum dot layer through reactions of the functional groups. This greatly improves the binding force of the quantum dot layer and avoids falling off. In some particular embodiments, a main body structure (for example, silicon oxide layer(s)) of the linking layer may be firstly introduced on a surface of the electron transport layer away from the substrate, with an effective connection between the linking layer and the electron transport layer being achieved via a chemical bond formed through a reaction between a silicon atom in the main body structure and a hydroxy on the surface of the electron transport layer. Then, a linking group is introduced on a surface of the main body structure away from the electron transport layer (for example, a functional region containing linking groups is formed through a reaction between a functionalized silane reagent and a hydroxy on the surface of the main body structure), and the linking group can react with the functional group in the quantum dot layer to form a chemical bonding. Thus, the quantum dot layer is bonded firmly via the chemical bond. In addition, the main body structure (silicon oxide layer(s)) of the linking layer can also be used as an electron blocking layer, to effectively control the electron injection rate, and thus control the carrier injection balance. As a result, an efficient and high resolution patterned quantum dot device is achieved, and the industrialization process of quantum dot is accelerated.

According to the embodiments of the present disclosure, the main body structure of the linking layer may be a silicon oxide type structure, comprising at least one silicon oxide layer. The silicon oxide layer contains an O—Si—O bond, wherein one silicon atom is bound to four atoms, and adjacent silicon atoms share a common oxygen atom, so as to form a network structure. According to the embodiments of the present disclosure, the number of the silicon oxide layer in the main body structure may be 1 to 15, for example, 1 to 10, or 1 to 5. By adjusting the thickness of the main body structure (the number of the silicon oxide layer), the electron injection rate can be flexibly controlled, such that the carrier injection of the quantum dot device baseplate is balanced and the luminescence efficiency is higher. In some particular embodiments, the main body structure (silicon oxide layer(s)) of the linking layer may have a thickness of 0.5 to 6 nm, such as 0.5 nm, 0.8 nm, 1 nm, 2 nm, 3 nm, 4 nm, 5 nm, and 6 nm. In the thickness range, the requirements for most quantum dot device baseplates can be satisfied, such that the carrier injection is balanced, achieving a higher luminescence efficiency, while the binding firmness of the quantum dot layer can be ensured.

Figure 2:
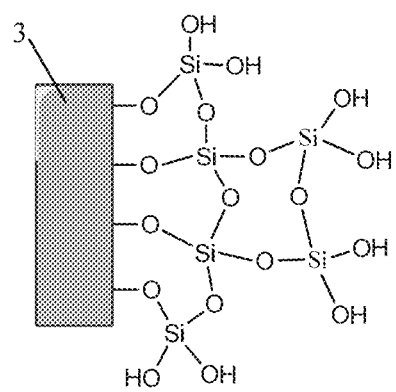
FIG. 2 is a schematic structural diagram after forming the main body structure of the linking layer on the electron transport layer according to one embodiment of the present disclosure.
Figure 3:
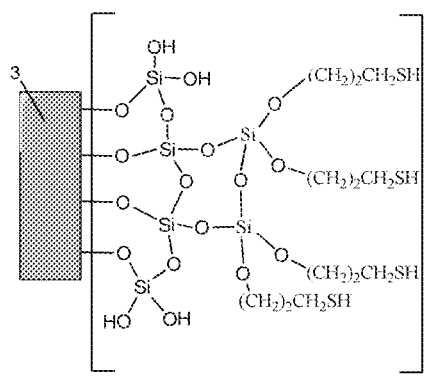
FIG. 3 is a schematic structural diagram after introducing the linking groups on the main body structure according to one embodiment of the present disclosure.
Figure 4:
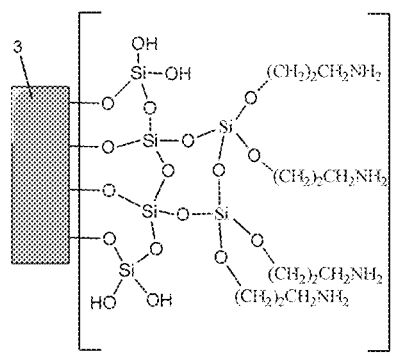
FIG. 4 is a schematic structural diagram after introducing the linking groups on the main body structure according to another embodiment of the present disclosure.

According to the embodiments of the present disclosure, a material for the electron transport layer may be a hydrophilic material, which has a hydroxy group on the surface and thus can be bonded to the linking layer (the main body structure) via an —O—Si— chemical bond (referring to FIG. 2 for the schematic structural diagram). On the other hand, a hydroxy group present on the other surface of the main body structure of the linking layer can react with a functionalized silane reagent to introduce a linking group capable of being bonded to the quantum dot (that is, to form a functional region containing linking groups) (referring to FIGS. 3 and 4 for the schematic structural diagrams, wherein FIG. 3 illustrates an example in which the silane reagent is 3-mercaptopropyl trimethoxysilane, and FIG. 4 illustrates an example in which the silane reagent is 3-aminopropyl trimethoxysilane). In some particular embodiments, the linking group (which can react with the quantum dot layer) introduced by reacting with the silane reagent comprises a mercapto group and/or an amino group, and so on. Thus, the linking layer is bonded to the quantum dot layer via a chemical bond formed between the mercapto group and/or amino group in the linking group and the quantum dot (for example, an coordination bond formed between the mercapto group or amino group and the quantum dot).

According to the embodiments of the present disclosure, the silane reagent comprises at least one selected from the group consisting of a thiolated silane reagent and an aminated silane reagent. The silane reagent can be hydrolyzed and react with the hydroxy group on the surface of the main body structure of the linking layer, to leave the corresponding linking group on the surface of the main body structure. As such, a chemical bonding to the quantum dot layer can be effectively formed through the mercapto group or amino group contained in the linking group. In particular, the thiolated silane reagent comprises at least one selected from the group consisting of 3-mercaptopropyl trimethoxysilane, 3-mercaptopropyl triethoxysilane, 3-mercaptopropyl methyl dimethoxysilane, 3-mercaptopropyl methyl diethoxysilane, mercaptopropylsilane, 3-mercaptopropyl trimethylsilane, PSS-(3-mercapto)propyl-heptaisobutyl substituted, and bis [3-(triethoxysilyl)propyl]-tetrasulfide. The aminated silane reagent comprises at least one selected from the group consisting of 3-aminopropyl trimethoxysilane, 3-aminopropyl triethoxysilane, 3-aminopropyl methyl diethoxysilane, N-(β-aminoethyl-γ-aminopropyl)trimethoxysilane, N-(β-aminoethyl-γ-aminopropyl) methyl dimethoxy silane, diethylenetriaminopropyl trimethoxysilane, 3-ureidopropyl trimethoxysilane, n-butylaminopropyl trimethoxysilane, N-(2-aminoethyl)-3-aminopropyl trimethoxysilane, N-[3-(trimethoxysilyl)propyl]ethylenediamine, 3-(phenylpropyl) propyl trimethoxysilane, N-phenyl-3-aminopropyl trimethoxysilane, 3-(2-aminoethyl)-aminopropyl trimethoxysilane, N-(n-butyl)-3-aminopropyl trimethoxysilane, and N-(β-aminoethyl-γ-aminopropyl)trimethoxysilane.

According to the embodiments of the present disclosure, a material for forming the quantum dot layer comprises at least one selected from the group consisting of CdTe, CdS, CdSe, ZnSe, InP, CuInS, CuInSe, PbS, CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, CsPbCl$_3$/ZnS, CsPbBr$_3$/ZnS, CsPhI$_3$/ZnS, an organic-inorganic perovskite quantum dot of CH$_3$NH$_3$PbX$_3$, an entirely inorganic perovskite quantum dot of CsPbX$_3$, a carbon quantum dot, and a silicon quantum dot, wherein X is Cl, Br or I. Therefore, the material has a wide variety of sources, is easy to obtain, and it can effectively satisfy the requirements for color display, and has a relatively high luminescence efficiency.

According to a particular embodiment of the present disclosure, the linking layer may be represented by a general formula below:

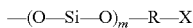

wherein (O—Si—O) represents a silicon oxide layer; m represents a number of the silicon oxide layer, and is in a range from 1 to 15; and R—X represents a linking group, wherein R represents a divalent organic group, preferably an alkylene group having a carbon atom number of 1 to 10, such as ethylene, propylene, and isopropylene, and X represents a mercapto group or an amino group.

Figure 5:
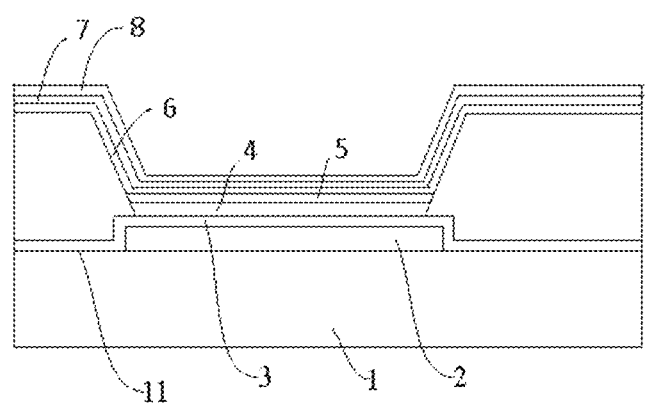
FIG. 5 is a schematic structural diagram of a quantum dot device baseplate according to another embodiment of the present disclosure.

According to a particular embodiment of the present disclosure, a structure of an example in which the baseplate is used as a display baseplate of a display device is described in detail. In particular, referring to FIG. 5, the display baseplate comprises a substrate 1, a cathode 2, an electron transport layer 3, a linking layer 4, a quantum dot layer 5, a hole transport layer 6, a hole injection layer 7 and an anode 8.

According to some embodiments of the present disclosure, the quantum dot device baseplate may comprise only one whole layer of quantum dot layer. In this instance, the cathode, the electron transport layer, the linking layer, the hole transport layer, the hole injection layer, the anode and so on in the quantum dot device baseplate all can have a whole layer structure corresponding to the quantum dot layer. According to some other embodiments of the present disclosure, the quantum dot device baseplate may comprise a patterned quantum dot layer, or the quantum dot layer may comprise a plurality of sub-layers arranged separately. In particular, for example, the display baseplate comprises a plurality of quantum dot light emitting layers of different colors. In this instance, if the plurality of sub-layers work synchronously, the cathode, the electron transport layer, the linking layer and so on in the quantum dot device baseplate can still have a whole layer structure. If the plurality of sub-layers are required to work independently, at least one of the cathode and the anode have a patterned structure, that is, at least one of the cathode and the anode comprise a plurality of sub-electrodes arranged separately, and each sub-electrode corresponds to one quantum dot layer. As a result, the plurality sub-electrodes provide different electrical signals to the plurality of sub-layers respectively, such that the sub-layers can work independently and do not interfere with each other. The electron transport layer, the linking layer, the hole transport layer, the hole injection layer and so on are also required to be disposed at each position corresponding to each sub-layer, and can be selected to have a whole layer structure or a patterned structure according to practical requirements. In some particular embodiments, the electron transport layer 3, the main body structure of the linking layer 4, the hole transport layer 6, the hole injection layer 7 and the anode 8 can have a whole layer structure, while the cathode 2 and the functional region containing linking groups of the linking layer 4 can have a patterned structure. In this instance, the main body structure of the linking layer 4 is still formed as a whole layer structure, but the linking groups are only introduced in some locations of the main body structure of the linking layer, for example, at a position corresponding to the quantum dot layer (to form a local functional region containing linking groups). Please note that FIGS. 1 and 5 herein illustrate one sub-pixel region in the display baseplate as an example, but it can be appreciated by those skilled in the art that the display baseplate may comprise a plurality of sub-pixel regions, and this will not be reiterated here.

In another aspect, the present disclosure provides a quantum dot device. According to the embodiments of the present disclosure, the quantum dot device comprises the quantum dot device baseplate as described previously. The quantum dot layer in the quantum dot device baseplate can be bound firmly, and is not liable to falling off and loss. As a result, the quantum dot device has a high display quality, the yield is high in the manufacture process, and the cost is low.

According to the embodiments of the present disclosure, the type of the quantum dot device is not particularly limited, and the quantum dot device may be a display device (such as a mobile phone, a tablet computer, a game console, and a wearable device), a light emitting device, a semiconductor device, a magnetic sensing device, a fluorescence sensing device, and so on. It can be appreciated by those skilled in the art that in addition to the baseplate as described previously, the quantum dot device further comprises other structures and components necessary for a conventional device. By taking a mobile phone as an example, the quantum dot device may further comprise a housing, a touch module, a camera module, a fingerprint identification module, a sound processing module, a mainboard, a memory, a necessary circuit structure, and so on, which will not be reiterated here.

In another aspect, the present disclosure provides a method for manufacturing the quantum dot device baseplate as described previously. According to the embodiments of the present disclosure, the method comprises: forming a cathode on a substrate; forming an electron transport layer on a surface of the cathode away from the substrate; forming a linking layer on a surface of the electron transport layer away from the substrate, with a chemical bonding being formed between the linking layer and the electron transport layer; and forming a quantum dot layer on a surface of the linking layer away from the substrate, with a chemical bonding being formed between the quantum dot layer and the linking layer. By the method, it allows the quantum dot layer to be chemically bonded to the electron transport layer via the linking layer. As such, due to good binding firmness, the quantum dots are not liable to falling off and loss, the manufacture yield is high, and the cost is relatively low. In addition, it can be appreciated that as the method can be effectively used in manufacturing the quantum dot device baseplate as described previously, related features and advantages as described previously can also apply to the method, and will not be reiterated here.

According to the embodiments of the present disclosure, the forming of the linking layer may comprise Step 1: forming a main body structure of the linking layer on the surface of the electron transport layer away from the substrate; and Step 2: introducing a linking group on a surface of the main body structure of the linking layer away from the electron transport layer (to form a functional region containing linking groups). Thus, the linking layer on one hand is chemically bonded to the electron transport layer through the silicon oxide (silicon atom therein) in the main body structure, and on the other hand is chemically bonded to the quantum dot layer through the linking group in the functional region. As a result, the binding force of the quantum dot layer is greatly improved, avoiding falling off and loss.

According to the embodiments of the present disclosure, in particular, Step 1 may comprise: spin coating a solution of silicon source on the surface of the electron transport layer away from the substrate, and leaving it under a room temperature condition for 1 minute to 2 hours, for example, 5 minutes to 1 hour. Thus, a silicon oxide layer (the main body structure of the linking layer) can be formed on the surface of the electron transport layer through the reaction of the silicon source, and be bonded to the electron transport layer through a Si—O bond formed by a reaction between the silicon atom and the hydroxy group on the surface of the electron transport layer. In particular, the rotation speed for spin coating may be 1000 to 4000 rpm, for example, 1000 to 1400 rpm, and the concentration by volume of the silicon source in the solution of silicon source may be 0.5% to 30%. Thus, the silicon oxide layer is allowed to have a suitable thickness. As a result, while the adhesion of the quantum dot layer is ensured, the electron injection rate can be effectively controlled, such that the carrier injection rate is balanced, and the luminescence efficiency of the quantum dot layer is higher. In some particular embodiments, the solution of silicon source is a solution formed by dissolving the silicon source as a solute in a solvent. The silicon source may comprise at least one selected from the group consisting of tetramethyl orthosilicate, tetraethyl orthosilicate, diphenyl dimethoxysilane, hexadecyl trimethoxysilane, isobutyl triethoxysilane, isobutyl trimethoxysilane, dimethyl dimethoxysilane, methyl tris(methylethylketoximino)silane, methyl triacetoxylsilane, isocyanatopropyl triethoxysilane, phenyl trimethoxysilane, phenyl triethoxysilane, octyl trimethoxysilane, n-octyl triethoxysilane, dodecyl triethoxysilane, dodecyl trimethoxysilane, and vinyl tris(methylethylketoximino)silane. The solvent may comprise at least one selected from the group consisting of ethanol, butanol, ethylene glycol, n-hexanol, octanol, decanol, undecanol and tetradecanol. In order to effectively facilitate formation of silicon dioxide (silicon oxide layer), a small amount of aqueous ammonia may be added to the solution of silicon source. In particular, the amount of the aqueous ammonia added to the solution of silicon source may be 0.1% to 5% (by volume).

According to the embodiments of the present disclosure, Step 2 may comprise: applying a solution of silane reagent on a surface of the main body structure of the linking layer away from the substrate, or immersing the surface of the main body structure of the linking layer away from the substrate into the solution of silane reagent for a predetermined time. The silane used in this step is the same as the silane reagent for introducing linking group as described previously, and will not be reiterated here. The solution of silane reagent may be a solution of silane reagent in toluene or in tetrahydrofuran.

According to the embodiments of the present disclosure, the above Step 1 and Step 2 may be carried out in an air atmosphere. Thus, the performance of the linking layer is not influenced, and relying on expensive glove box can be eliminated.

According to particular embodiments of the present disclosure, the main body structure of the linking layer may be a whole layer structure, and the functional region containing linking groups may have a patterned structure. Thus, the binding force of the quantum dot layer can be effectively increased at a desired position, whereas at a position where no quantum dot layer is required to be formed, the quantum dots are liable to falling off, which is convenient for processing.

In a particular embodiment, after forming the main body structure (silicon oxide layer) of the linking layer, steps of applying photoresist, exposing and developing can be performed in sequence, to expose a position where the functional region is required to be formed. Then the functional region is formed at corresponding position, and after that, the photoresist is stripped off. In particular, 100 to 150 µL of photoresist (positive photoresist, such as DL1001C) is dropped on to the silicon oxide layer, by a spin coater at a selected rotation speed of 500 to 4000 rpm. The product is placed on a heating stage at 50 to 200° C. and heated to form a film. Then, a region where a quantum dot layer is required to be formed is exposed with a mask plate by using an exposer. The exposed product is placed in an alkali solution with a mass fraction of 5% (which may be an aqueous solution of tetramethylammonium hydroxide, aqueous ammonia, or the like), immersed for 30 to 300 s, then washed with deionized water, and blow-dried, to expose the region where a quantum dot layer is required to be formed. Then, a solution of silane reagent is dropped on the region, or the developed product is immersed in the solution of silane reagent for a certain time.

According to the embodiments of the present disclosure, the quantum dot layer may be formed by a "lift-off" process of photolithography. In particular, the process may comprise: forming a whole layer of quantum dot layer on a whole surface away from the substrate of the product obtained after forming the linking layer; forming a whole layer of photoresist layer on a surface of the whole quantum dot layer away from the substrate, and performing full exposure and development treatments on the whole photoresist layer in sequence to obtain the quantum dot layer. In this step, full exposure means that the whole layer of photoresist is subjected to exposure and development treatments, and then the whole layer of photoresist is removed. Because a functional region containing linking groups has been formed at the position where a quantum dot layer is required to be formed and can be chemically bonded to the quantum dot layer, the quantum dot layer in this region will not fall off together with photoresist in the development treatment, due to the firm binding, whereas at the position where no functional region of the linking layer is formed, the quantum dot layer has a low binding force, and will fall off together with photoresist, so as to conveniently form the quantum dot layer at a desired position.

In a particular embodiment, a low boiling point solution of quantum dot, such as a solution of quantum dot in n-hexane or n-octane, is spin coated, and dried at 80 to 120° C. to form a film. Then, the whole layer of quantum dot film is fully exposed by using an exposer. Then, the fully exposed product is placed in an alkali solution with a mass fraction of 5% (which may be an aqueous solution of tetramethylammonium hydroxide, aqueous ammonia, or the like), immersed for 30 to 300 s, then washed with deionized water, and blow-dried.

The reaction process for forming the linking layer and the quantum dot layer will be described in detail below with an example where the electron transport layer is a zinc oxide layer, the silicon source for forming the main body structure (silicon oxide layer) of the linking layer is tetraethyl orthosilicate (TEOS), and the silane reagent for forming the functional region is 3-mercaptopropyl trimethoxylsilane (MPTEMS). In particular, referring to FIG. 6, TEOS initially contacts with the hydrophilic zinc oxide surface and chemically connected thereto (referring to (a) of FIG. 6); with further contact of the hydrophilic zinc oxide surface with TEOS, intermolecular connection occurs between TEOS molecules (referring to (b) of FIG. 6); with further increase of contact time, a silicon oxide layer, i.e., the main body structure of the linking layer, will be formed on the zinc oxide surface (referring to (c) of FIG. 6). Subsequently, a silane reagent is added to introduce a linking group on the other surface of the silicon oxide layer, referring to FIG. 7, MPTEMS is hydrolyzed and the hydrolyzed product is connected to silicon oxide via a chemical bond, with the outermost end being a free mercapto functional group. Subsequently, a quantum dot layer is formed on the linking layer. The free mercapto group on the surface of the linking layer can react with the quantum dot layer to form a chemical bond, such that the linking layer can act as a "bridge" connecting the hydrophilic zinc oxide layer and the hydrophobic quantum dot layer.

Figure 6:
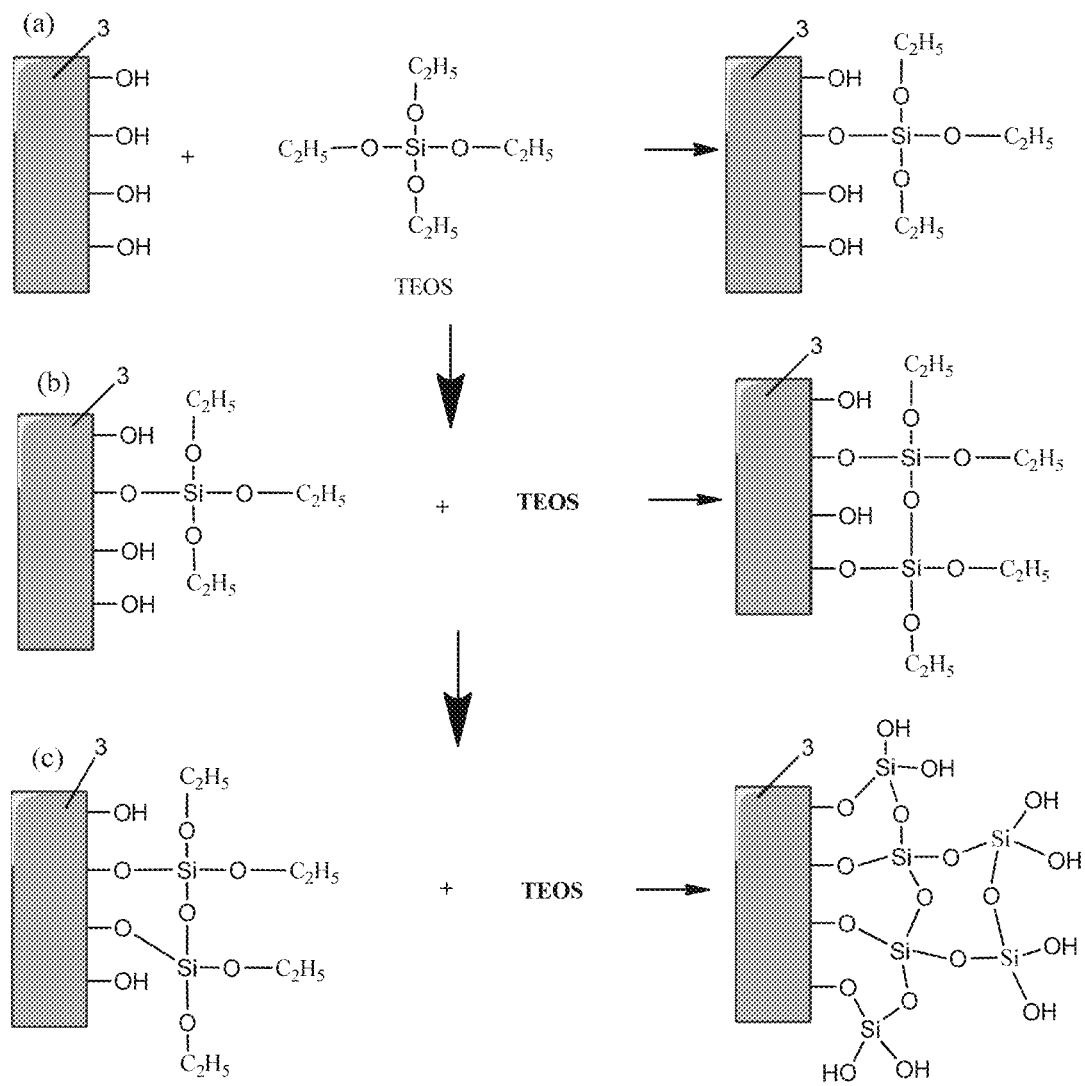
FIG. 6 is a schematic diagram of a reaction process for forming the main body structure of the linking layer according to one embodiment of the present disclosure.
Figure 7:
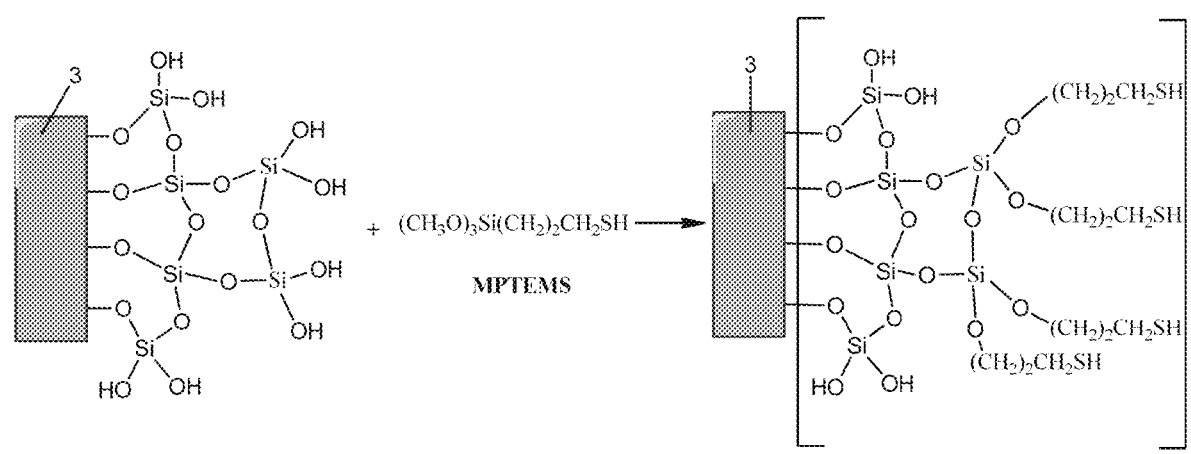
FIG. 7 is a schematic diagram of a reaction process for introducing the linking groups on the main body structure according to one embodiment of the present disclosure.
Figure 8:
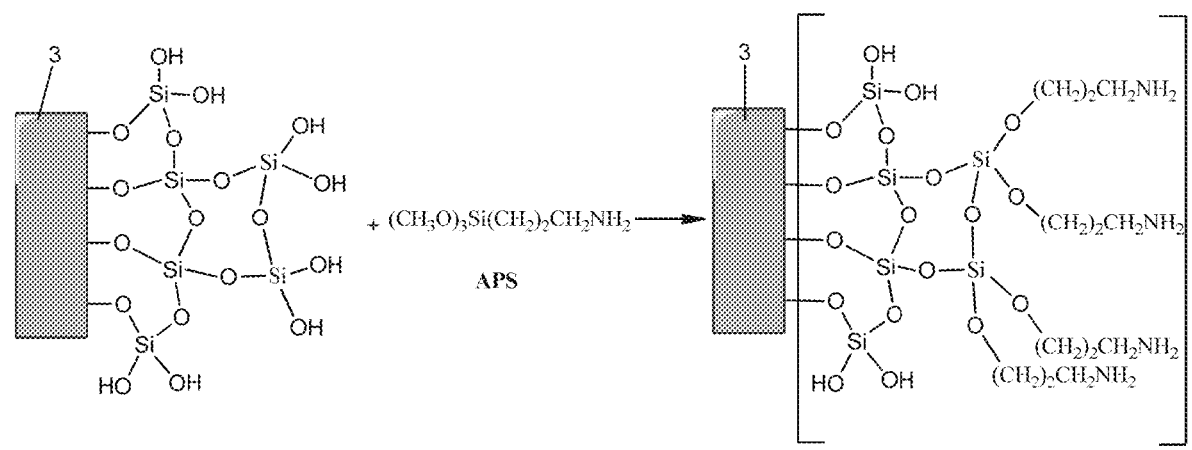
FIG. 8 is a schematic diagram of a reaction process for introducing the linking groups on the main body structure according to another embodiment of the present disclosure.

In another particular embodiment, the silane reagent is 3-aminopropyl trimethoxysilane (APS), reference can be made to FIG. 6 for the reaction process for forming the main body structure (silicon oxide layer) of the linking layer, reference can be made to FIG. 8 for the reaction process for introducing the linking group, and the reaction process for forming the quantum dot layer is the same as above.

It can be appreciated that, for a display baseplate in which a plurality of light emitting layers of different colors are required to be disposed, one quantum dot light emitting layer can be fabricated at each time, and quantum dot light emitting layers of different colors can be formed respectively in respective regions corresponding to pixels of different colors by repeating the above-mentioned steps, which are not reiterated here.

According to the embodiments of the present disclosure, the above-mentioned method for manufacturing a quantum dot device baseplate may further comprise: forming a hole transport layer 6 on a surface of the quantum dot light emitting layer away from the substrate; forming a hole injection layer 7 on a surface of the hole transport layer 6 away from the substrate; and forming an anode 8 on a surface of the hole injection layer 7 away from the substrate. In particular, the hole transport layer can be formed on the surface of the quantum dot layer away from the substrate by evaporation deposition, followed by a drying process to form a film (a material for the hole transport layer may be an organic material or an inorganic material, and in particular, the organic material for the hole transport layer may be an aromatic diamine-based derivative, such as N,N'-diphenyl-N,N'-(1-naphthyl)-1,1'-biphenyl-4,4'-diamine, N,N'-diphenyl-N,N'-bis(3-methylphenyl)-1,1'-biphenyl-4,4'-diamine, 4,4'-cyclohexyl-bis[N,N-(4-methylphenyl)aniline], N,N'-diphenyl-N,N'-bis(4-methylphenyl)biphenyl-4,4'-diamine, or poly(9,9-dioctylfluorene-co-N-(4-butylphenyl)diphenylamine) (TFB), and the inorganic material for the hole transport layer may be NiO, $WO_3$, and so on). Then, the hole injection layer is formed by evaporation deposition followed by a drying process to form a film (a material for the hole injection layer may be a poly(3,4-ethylenedioxythiophene)-based compound, such as PEDOT4083 or PEDOT1.3N; or poly(3,4-ethylenedioxythiophene): polystyrene sulfonate, such as PEDOT: PSS). Then, an Ag, Au or Al film or a composite film of alloy material (such as Mg:Ag (10:1) and Li:Al (0.6% Li)) is formed by evaporation deposition, or an indium zinc oxide film (IZO) is formed by sputtering, as the anode.

It can be appreciated that, in order to better ensure the work performance of the quantum dot device, the product obtained after forming the anode may be packaged. In particular, the device may be packaged with UV-curing adhesive under activation such as UV light.

The Examples of the present disclosure will be described in detail below.

Example 1: Manufacture of a Full-Color Display Baseplate

1. Introducing a red quantum dot light emitting layer into a red pixel region, comprising the following steps.
(1) Washing: an ITO glass is ultrasound-washed with isopropanol, water and acetone respectively, and treated with UV light for 5 min.
(2) Spin coating a zinc oxide film: 4.5 g of zinc nitrate dihydrate solid is added into a solvent containing 10 mL of ethanolamine and n-butanolamine, spin coated in air with a rotation speed of 2000 rpm to form a film, and the film is heated on a heating stage at 200° C.
(3) Introducing a silicon oxide film: a solution of tetraethyl orthosilicate in ethanol is prepared (tetraethyl orthosilicate: 0.5 mL, ethanol: 4.5 mL) with a small amount of aqueous ammonia added (0.1 mL), spin coated in air with a rotation speed of 2500 rpm to form a film, and the film is left standing at room temperature for 5 min (that is, TEOS hydrolysis time is 5 min). The thickness of the silicon oxide film layer can be controlled to be 0.8 nm by controlling the concentration of the silane solution, the rotation speed, and the standing time after spin coating the silane reagent.
(4) Applying photoresist (positive photoresist): 150 μL of photoresist (positive photoresist, such as DL1001C) is dropped on the ITO glass, with the rotation speed of the spin coater selected to be 4000 rpm, and the product is placed on a heating stage at 100° C. and heated to form a film.
(5) Exposing with a mask plate: an aligning adjustment is performed on the exposer and the ITO glass, and the red pixel region on the ITO glass is exposed with a mask plate.
(6) Developing: the exposed ITO glass is placed in an alkali solution with a mass fraction of 5% (which may be an aqueous solution of tetramethylammonium hydroxide, aqueous ammonia, or the like), immersed for 200 s, then washed with deionized water, and blow-dried.
(7) Introducing a silane reagent: a layer of 3-mercaptopropyl trimethoxysilane (MPTES) is applied on the above ITO glass. In particular, the step comprises dissolving 3-mercaptopropyl trimethoxysilane in toluene or tetrahydrofuran and dropping 30 μL of resultant solution on the ITO glass.
(8) Spin coating red quantum dot: a low boiling point solution of red quantum dot, such as a solution of quantum dot in n-hexane or n-octane, is spin coated on the substrate obtained above, and dried at 85° C. to form a film.
(9) Fully exposing: the whole ITO glass is fully exposed with an exposer.
(10) Developing: the fully exposed ITO glass is placed in an alkali solution with a mass fraction of 5% (which may be an aqueous solution of tetramethylammonium hydroxide, aqueous ammonia, or the like), immersed for 200 s, then washed with deionized water, and blow-dried. After developing, red quantum dots in the green and blue pixel regions leave the ITO glass with stripping off the photoresist, while ZnO in the red pixel region is linked to the red quantum dots through the silicon oxide layer and the functional region, thereby introducing red quantum dots in the red pixel region.
2. Repeating the above step 1 (without performing sub-step (3)) to introduce green quantum dots in the green pixel region.

3. Repeating the above step 1 (without performing sub-step (3)) to introduce blue quantum dots in the blue pixel region. As such, a full-color, high resolution and patterned quantum dot light emitting layer is introduced on the ITO glass.

4. Introducing a hole transport layer and a hole injection layer: a compound of N,N'-diphenyl-N,N'-(1-naphthyl)-1,1'-biphenyl-4,4'-diamine is spin coated on the above-mentioned ITO glass with patterned red, green and blue quantum dots, and is dried to form a film as the hole transport layer. And then PEDOT4083 is spin coated and dried to form a film as the hole injection layer.

5. Introducing an anode: an Ag film is evaporation deposited as the anode.

6. Packaging: the device is packaged with UV-curing adhesive under activation such as UV light.

Example 2

Example 2 is the same as Example 1, except that the time for standing at room temperature after spin coating is 10 min, for forming a silicon oxide layer having a thickness of 1.4 nm.

Example 3

Example 3 is the same as Example 1, except that the time for standing at room temperature after spin coating is 20 min, for forming a silicon oxide layer having a thickness of 3.2 nm.

Example 4

Figure 9:
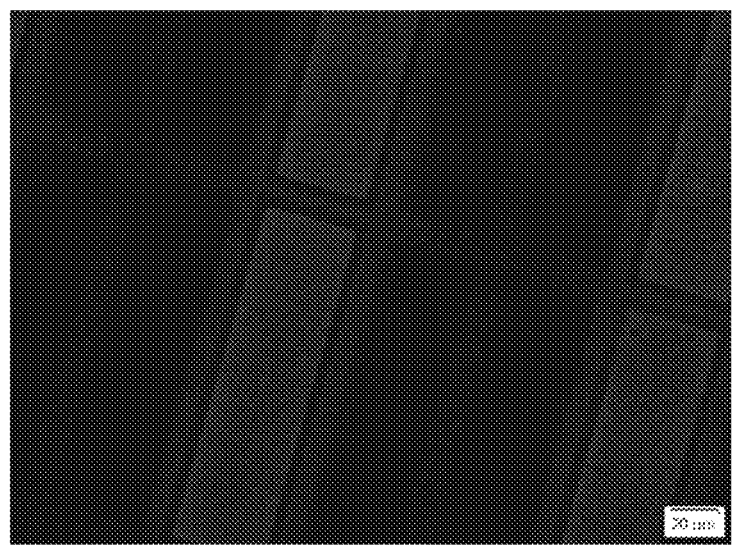
FIG. 9 is a fluorescence microscope photograph (excited at 450 nm) of the display baseplate in Example 4 of the present disclosure.

Example 4 is the same as Example 1, except that the time for standing at room temperature after spin coating is 30 min, for forming a silicon oxide layer having a thickness of 4.6 nm. The fluorescence microscope photograph (excited at 450 nm) of the red pixel region with red quantum dots introduced is shown in FIG. 9, and the resolution of the display baseplate is 80 ppi.

Comparative Example 1

Comparative Example 1 is the same as Example 1, except that sub-step (3) to sub-step (7) are not performed.

Comparative Example 2

Comparative Example 2 is the same as Example 1, except that sub-step (3) is not performed.

Performance Test:

For the above Examples 1-4 and Comparative Examples 1-2, a breakage ratio of red quantum dot in the red pixel region is calculated after introducing the red quantum dots into the red pixel region. The equation for the breakage ratio is shown below:

$$\Phi = \frac{Nx}{100} \times 100\%$$

wherein Φ represents a breakage ratio (%) of the pixel region, Nx represents a number of broken pixel region in 100 successive neighboring pixel regions as counted, and the broken pixel region means a pixel region in which the falling off or loss of the quantum dots occurs. The statistic result is shown in the table below.

| | TEOS hydrolysis time (min) | SiO$_2$ thickness (nm) | MPTES amount (µL) | Pixel breakage ratio |
|---|---|---|---|---|
| Comparative Example 1 | 0 min | None | None | 47% |
| Comparative Example 2 | 0 min | None | 30 µL | 36% |
| Example 1 | 5 min | 0.8 nm | 30 µL | 30% |
| Example 2 | 10 min | 1.4 nm | 30 µL | 23% |
| Example 3 | 20 min | 3.2 nm | 30 µL | 12% |
| Example 4 | 30 min | 4.6 nm | 30 µL | 5% |

In the description of the present disclosure, it should be understood that the term "first" or "second" is only used for description purpose, but cannot be understood to indicate or suggest the relative importance or to imply the number of the indicated technical features. Therefore, the feature defined with "first" or "second" may explicitly or implicitly comprise one or more such feature(s). In the description of the present disclosure, unless specifically and particularly defined otherwise, "a plurality of" refers to two or more.

In the description of this specification, the description with reference to term "an embodiment", "some embodiments", "example", "particular example", "some examples", or the like means that the particular feature, structure, material or characteristic described with reference to the embodiment or example is included in at least one embodiment or example of the present disclosure. In this specification, the exemplary expressions of the above terms are not required to refer to the same embodiment or example. And the particular feature, structure, material or characteristic described can be combined in a suitable manner in any one or more embodiments or examples. Further, without contradicting with each other, different embodiments or examples as well as the features of different embodiments or examples described in this specification can be combined by those skilled in the art.

Although the embodiments of the present disclosure have been shown and described above, it can be appreciated that the above embodiments are exemplary, and should not be construed as limiting the present invention. A person of ordinary skills in the art can make change, modification, replacement and variation on the above embodiments within the scope of the present invention.

What is claimed is:

1. A quantum dot device baseplate, comprising:
a substrate;
a cathode disposed on the substrate;
an electron transport layer disposed on a surface of the cathode away from the substrate;
a linking layer disposed on a surface of the electron transport layer away from the substrate and bonded to the electron transport layer via chemical bonding; and
a quantum dot layer disposed on a surface of the linking layer away from the substrate and bonded to the linking layer via chemical bonding,
wherein the linking layer is represented by a general formula below:

—(O—Si—O)m-R—X wherein (O—Si—O) represents a silicon oxide layer; m represents a number of the silicon oxide layer, and is in a range from 1 to 15; and R—X represents a linking group, wherein R represents a divalent organic group, and X represents a mercapto group or an amino group.

2. The quantum dot device baseplate according to claim 1, wherein the linking layer comprises a main body structure having a first surface facing the electron transport layer and a second surface away from the electron transport layer.

3. The quantum dot device baseplate according to claim 2, wherein the main body structure is a silicon oxide type structure comprising at least one silicon oxide layer.

4. The quantum dot device baseplate according to claim 3, wherein the linking layer is bonded to the electron transport layer via a Si—O bond formed by a silicon atom on the first surface and an oxygen atom on the surface of the electron transport layer away from the substrate.

5. The quantum dot device baseplate according to claim 3, wherein the linking layer has the linking group on the second surface of the main body structure, and is bonded to the quantum dot layer via a chemical bond formed between the linking group and a quantum dot.

6. The quantum dot device baseplate according to claim 5, wherein a projection of a region in which the linking group is located on the substrate is at least partially overlapped with a projection of the quantum dot layer on the substrate.

7. The quantum dot device baseplate according to claim 1, wherein a material for the electron transport layer comprises at least one selected from the group consisting of zinc oxide, magnesium zinc oxide, aluminum zinc oxide, indium zinc oxide, and a rare earth ion doped zinc oxide.

8. The quantum dot device baseplate according to claim 1, wherein a material for the quantum dot layer comprises at least one selected from the group consisting of CdTe, CdS, CdSe, ZnSe, InP, CuInS, CuInSe, PbS, CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, CsPbCl$_3$/ZnS, CsPbBr$_3$/ZnS, CsPhI$_3$/ZnS, an organic-inorganic perovskite quantum dot of CH$_3$NH$_3$PbX$_3$, an entirely inorganic perovskite quantum dot of CsPbX$_3$, a carbon quantum dot, and a silicon quantum dot, wherein X is Cl, Br or I.

9. A quantum dot device comprising the quantum dot device baseplate according to claim 1.

10. A method for manufacturing the quantum dot device baseplate according to claim 1, comprising:
    forming a cathode on a substrate;
    forming an electron transport layer on a surface of the cathode away from the substrate;
    forming a linking layer on a surface of the electron transport layer away from the substrate, with chemical bonding being formed between the linking layer and the electron transport layer; and
    forming a quantum dot layer on a surface of the linking layer away from the substrate, with chemical bonding being formed between the quantum dot layer and the linking layer,
    wherein the linking layer is represented by a general formula below:

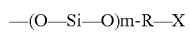
    —(O—Si—O)m-R—X wherein (O—Si—O) represents a silicon oxide layer; m represents a number of the silicon oxide layer, and is in a range from 1 to 15; and R—X represents a linking group, wherein R represents a divalent organic group, and X represents a mercapto group or an amino group.

11. The method according to claim 10, wherein the forming of the linking layer comprises:
    Step 1: applying a solution of silicon source on the surface of the electron transport layer away from the substrate, and forming a main body structure of the linking layer on the surface of the electron transport layer through a reaction between the silicon source and the surface; and
    Step 2: contacting the main body structure obtained in Step 1 with a solution of silane reagent to introduce the linking group on a surface of the main body structure away from the electron transport layer.

12. The method according to claim 11, wherein the surface of the electron transport layer away from the substrate is a hydrophilic surface, and the linking layer is bonded to the electron transport layer via a Si—O bond formed by a silicon atom and an oxygen atom on the surface of the electron transport layer.

13. The method according to claim 11, wherein the silicon source comprises at least one selected from the group consisting of tetramethyl orthosilicate, tetraethyl orthosilicate, diphenyl dimethoxysilane, hexadecyl trimethoxysilane, isobutyl triethoxysilane, isobutyl trimethoxysilane, dimethyl dimethoxysilane, methyl tris(methylethylketoximino)silane, methyl triacetoxylsilane, isocyanatopropyl triethoxysilane, phenyl trimethoxysilane, phenyl triethoxysilane, octyl trimethoxysilane, n-octyl triethoxysilane, dodecyl triethoxysilane, dodecyl trimethoxysilane, and vinyl tris(methylethylketoximino)silane.

14. The method according to claim 11, wherein the main body structure has a thickness of 0.5 to 6 nm.

15. The method according to claim 11, wherein the silane reagent comprises at least one selected from the group consisting of a thiolated silane reagent and an aminated silane reagent.

16. The method according to claim 15, wherein the thiolated silane reagent comprises at least one selected from the group consisting of 3-mercaptopropyl trimethoxysilane, 3-mercaptopropyl triethoxysilane, 3-mercaptopropyl methyl dimethoxysilane, 3-mercaptopropyl methyl diethoxysilane, mercaptopropylsilane, 3-mercaptopropyl trimethylsilane, PSS-(3-mercapto)propyl-heptaisobutyl substituted, and bis[3-(triethoxysilyl)propyl]-tetrasulfide.

17. The method according to claim 15, wherein the aminated silane reagent comprises at least one selected from the group consisting of 3-aminopropyl trimethoxysilane, 3-aminopropyl triethoxysilane, 3-aminopropyl methyl diethoxysilane, N-(β-aminoethyl-γ-aminopropyl)trimethoxysilane, N-(β-aminoethyl-γ-aminopropyl) methyl dimethoxy silane, diethylenetriaminopropyl trimethoxysilane, 3-ureidopropyl trimethoxysilane, n-butylaminopropyl trimethoxysilane, N-(2-aminoethyl)-3-aminopropyl trimethoxysilane, N-[3-(trimethoxysilyl)propyl]ethylenediamine, 3-(phenylpropyl)propyl trimethoxysilane, N-phenyl-3-aminopropyl trimethoxysilane, 3-(2-aminoethyl)-aminopropyl trimethoxysilane, N-(n-butyl)-3-aminopropyl trimethoxysilane, and N-(β-aminoethyl-γ-aminopropyl) trimethoxysilane.

18. The method according to claim 11, wherein Step 1 and Step 2 are carried out in an air atmosphere.

* * * * *